(12) United States Patent
Cewers

(10) Patent No.: US 6,236,276 B1
(45) Date of Patent: May 22, 2001

(54) METHOD FOR SEEKING AND SETTING A RESONANT FREQUENCY AND TUNER OPERATING ACCORDING TO THE METHOD

(75) Inventor: Göran Cewers, Lund (SE)

(73) Assignee: Siemens-Elema AB, Solna (SE)

( * ) Notice: Subject to any disclaimer, the term of this patent is extended or adjusted under 35 U.S.C. 154(b) by 0 days.

(21) Appl. No.: 09/468,035

(22) Filed: Dec. 21, 1999

(30) Foreign Application Priority Data

Dec. 22, 1998 (SE) ...................................... 9804484

(51) Int. Cl.$^7$ .............................. H03L 7/00; G01R 27/28; G01R 29/22
(52) U.S. Cl. ................................ 331/4; 324/652; 324/727
(58) Field of Search .................................. 331/4; 324/600, 324/602, 603, 605, 609, 652, 727

(56) References Cited

U.S. PATENT DOCUMENTS

| | | |
|---|---|---|
| 3,593,125 * | 7/1971 | Wilhelm et al. ........................ 324/56 |
| 4,808,948 | 2/1989 | Patel et al. . |
| 4,901,034 | 2/1990 | Frank-Peter . |
| 5,216,338 | 6/1993 | Wilson . |
| 5,588,592 | 12/1996 | Wilson . |

FOREIGN PATENT DOCUMENTS 0 359 217   3/1990   (EP) .

OTHER PUBLICATIONS

Patent Abstracts of Japan, Abstract of Japanese Application 5–203485, Aug. 10, 1993.
Patent Abstracts of Japan, Abstract of Japanese Application 58–178266, Oct. 19, 1983.

* cited by examiner

Primary Examiner—David Mis
(74) Attorney, Agent, or Firm—Schiff Hardin & Waite

(57) ABSTRACT

In a method for seeking and setting a resonant frequency for a load impedance and a tuner for carrying out the method, a first frequency sweep is performed over a predetermined frequency interval in order to identify the resonant frequency within the predetermined frequency interval. To maintain the correct resonant frequency, regardless of signal drift and other interference, repeated sweeps are automatically performed within the predetermined frequency interval to identify the resonant frequency repeatedly. Alternating semi-sweeps can be performed to reduce the sweep duration.

8 Claims, 2 Drawing Sheets

METHOD FOR SEEKING AND SETTING A RESONANT FREQUENCY AND TUNER OPERATING ACCORDING TO THE METHOD

BACKGROUND OF THE INVENTION

1. Field of the Invention

The present invention relates to a method for seeking and setting a resonance frequency of the type wherein a predetermined frequency interval is swept to locate a resonant frequency in the intervals, as well as a tuner operating according to the method.

2. Description of the Prior Art

Ultrasound is often used e.g. for nebulizing (atomizing) medication to be delivered to a patient connected to a ventilator. Ultrasound can be appropriately generated with a piezoelectric crystal. The crystal is then a frequency-determining component in an oscillator. The frequency of the ultrasound then depends on the resonant frequency. The acousto-mechanical model is complex for this type of oscillator, especially when electrical impedances in the signal transmission etc. are taken into account. There is then the risk that more than one resonant peak could lie with a specific frequency range. Only one of these peaks coincides with mechanical resonance and elicits the largest output from the crystal. The piezoelectric crystal can be viewed as a load impedance.

In principle, "load impedance" in this description refers to all kinds of loads, i.e. a load which can be wholly resistive, wholly inductive, wholly capacitive or a mixture of two or more of these. The character of the load also can change during operation and, e.g., vary from inductive to capacitive.

One way to find the resonant frequency is to sweep across a predetermined frequency interval and then lock modulation to the frequency yielding the highest peak.

As a result of signal drift, temperature drift etc., problems will develop when the modulation fails to produce the right frequency over time.

One way to solve this problem has been to use a phase locked loop (PLL). This means that an error signal, corresponding to drift in the system, is determined, and modulation is reset to the preset frequency.

Neither of these methods takes into account the fact that the mechanical resonance frequency can change for some reason. One such change can be caused by changes in the mechanical load on the crystal or changes in temperature.

Another problem is also that there are usually several variables involved during the searching for a resonant frequency, all of which influence the searching. Overshooting also is a problem that mainly occurs when a sweep is made at a relatively high speed in relation to time constants of components etc. An overshoot may lead to less accuracy in identifying the proper resonant frequency.

SUMMARY OF THE INVENTION

An object of the present invention is to achieve a method of the type initially described that solves the aforementioned problems.

Another object of the present invention to achieve a tuner capable of performing the inventive method.

The above object is achieved is achieved in accordance with the principles of the present invention in a method for seeking and setting a resonant frequency for a load impedance wherein a first frequency sweep is made over a predetermined frequency interval so as to identify the resonant frequency in this predetermined frequency interval, and wherein repeated sweeps of the predetermined frequency interval are subsequently made in order to repeated identify (update) the resonant frequency.

When repeated sweeps are performed, the modulation can always be related to a relatively recent frequency sweep and identification of the "updated" resonant frequency. Irrespective of whether drift occurs in the control electronics or changes occur in the oscillator which the capacitive load constitutes, the identified resonant frequency will come as close as possible to the true resonant frequency.

The resonant frequency is preferably and advantageously identified as the frequency resulting in the lowest output from the tuner in order to maintain a constant current consumption.

The repeated sweeps are advantageously performed at specific intervals. These intervals can be related to anticipated deviations due to, e.g., signal drift.

As an alternative or a complement, the repeated sweeps can be performed within restricted frequency ranges within the pre-set or predetermined frequency interval. A restricted sweep makes it possible to use a slower sweep without increasing the impact on modulation during the time the sweep is being performed. The biggest advantage of a slower sweep is that signal overshoot is avoided in determinations of the resonant frequency.

One way to arrive at a minimal restricted interval is to select a frequency range around the most recently identified resonance frequency in relation to anticipated signal drift. Anticipated signal drift can, in turn, be assessed dependent on the electrical components being used etc.

Another way to achieve a restricted frequency range is to start with a sweep at the most recently identified resonant frequency and then proceed to a lower end frequency. If a better resonant frequency is encountered within this range, the output signal is changed to this resonant frequency. Otherwise, the output signal is retained unchanged. At the next sweep, the sweep is started at the most recently identified resonant signal (i.e. the prevailing output signal) and then proceeds to a higher end frequency. In the same way as in the preceding sweep, the output signal is changed to a new resonant frequency if a better one is found.

With this procedure, the output signal and searches for the resonant frequency are continuously adapted to any changes in the resonance frequency (irrespective of whether the changes are caused by signal drift in the control electronics to actual changes in the resonant frequency of the load impedance (i.e. the piezocrystal).

Alternating semi-sweeps of this kind also make it possible to sweep a larger total frequency range (than if the same frequency range were swept every time) without any -increased interference with the operation in question (e.g. nebulization) and without risking any particularly large signal drifting. In addition, the risk of overshoot is reduced, since the "true" resonant frequency should be relatively close to the most recently identified resonant frequency.

The lower and upper end frequencies respectively, can be existing frequency limits for a predetermined frequency interval, but other limits are obviously conceivable. The most extreme interval is achieved by alternatively sweeping half the frequency range for the aforementioned minimal restricted interval (based on possible signal drift in system components)

The above object is also achieved is achieved in accordance with the principles of the present invention in a tuner connected to a load impedance, wherein the tuner has a control unit and sweep electronics for performing sweeps of a predetermined frequency interval in order to identify the resonant frequency of the load impedance, the sweep electronics generating an output signal representing the identified resonant frequency, and wherein the control unit operates the sweep electronics so as to perform repeated sweeps within the predetermined frequency interval so as to repeatedly identify (update) the resonant frequency.

In principle, the tuner is devised to carry out the aforementioned method.

One way of identifying the resonant frequency is achieved in an embodiment wherein the tuner has a current measuring unit that measures feedback current from an output stage. The output stage is connected between the tuner and the load impedance and constitutes, in principle, an amplifier for the output'signal from the tuner. The output stage is devised so constant current consumption prevails. In that manner, the resonant frequency can be defined as the frequency which results in the lowest output signal from the tuner in maintaining constant current consumption in the output stage.

When constant current consumption is maintained, impedance or admittance can be used as the actual measurement parameter to which the frequency sweep is related. If impedance is measured, it must be at a minimum at the resonant frequency. If admittance is measured, it must be at a maximum at the resonant frequency.

DESCRIPTION OF THE PREFERRED EMBODIMENTS

Figure 1:
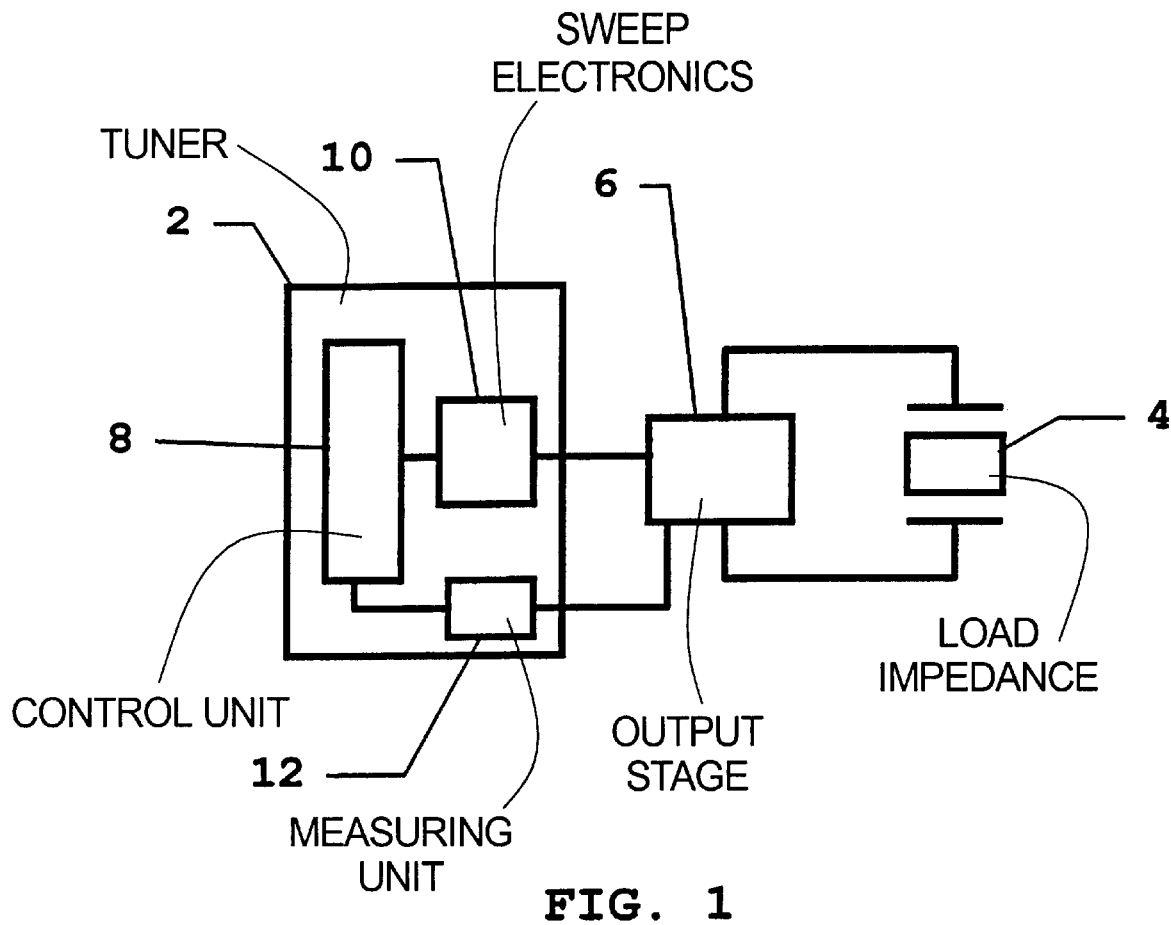
FIG. 1 shows an embodiment of the tuner according to the invention.

FIG. 1 shows an embodiment of a tuner 2 according to the invention. The tuner 2 is connected to an load impedance 4 via an output stage 6. In this instance, the load impedance 4 is a piezoelectric crystal whose purpose is to generate ultrasound for e.g. nebulizing medication.

As explained above, "load impedance" refers to all kinds of loads, i.e. a load which can be wholly resistive, wholly inductive, wholly capacitive or a mixture of two or more of these. The character of the load impedance 4 also can change during operation and e.g. vary from inductive to capacitive.

The tuner 2 (depicted schematically) includes a control unit 8, sweep electronics 10 and a current measuring unit 12. The current measuring unit 12 measures a feedback current from the output stage 6. When a predetermined frequency interval is swept with the sweep electronics 10, the control unit 8 is able to identify the output signal producing the most effective output from the load impedance 4. This signal corresponds to the best matching of the mechanical resonance frequency and the electrical resonance frequency for the load impedance 4.

Figure 2:
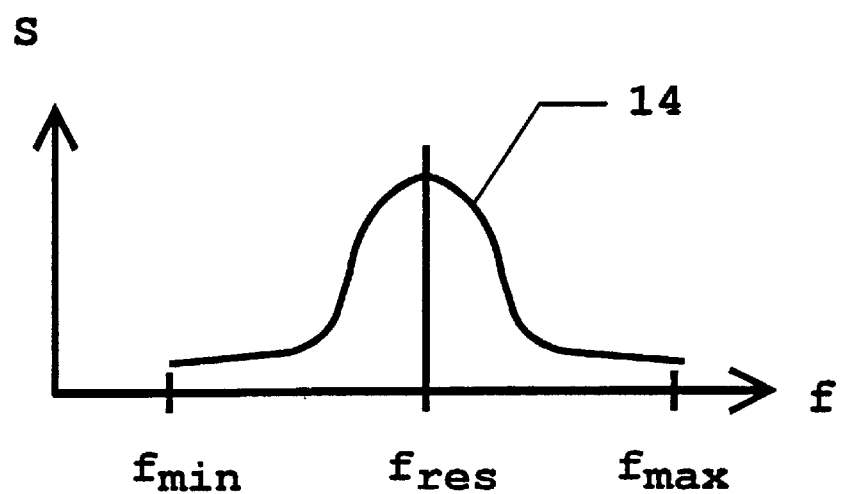
FIG. 2 is a diagram illustrating the way admittance varies with frequency.

FIG. 2 is a diagram showing admittance S on the y-axis and frequency f on the x-axis. A resonant frequency $f_{res}$ can be identified by sweeping the frequency f from a minimum $f_{min}$ to a maximum $f_{max}$ and measuring admittance S. The curve obtained is designated 14. The output signal from the tuner 2 can then be locked to this resonant frequency $f_{res}$ As a result of normal signal drift in electrical components, variations in temperature and interference, the output signal from the tuner will ultimately drift away from the resonant frequency $f_{res}$. In addition, the mechanical resonant frequency for the load impedance 4 can shift somewhat due to changes in external conditions. This impairs effectiveness.

Repeated sweeps across the predetermined frequency interval $f_{min}$–$f_{max}$ are performed to keep this from happening. These repeated sweeps are performed automatically at predetermined intervals.

Sweeps should be performed relatively slowly (in relation to time constants for the components used) to keep overshoot and hysteresis in electrical components from degrading resolution in identification of the resonant frequency. However, this has an impact on function by reducing output from the load impedance 4 during the sweep.

Figure 3:
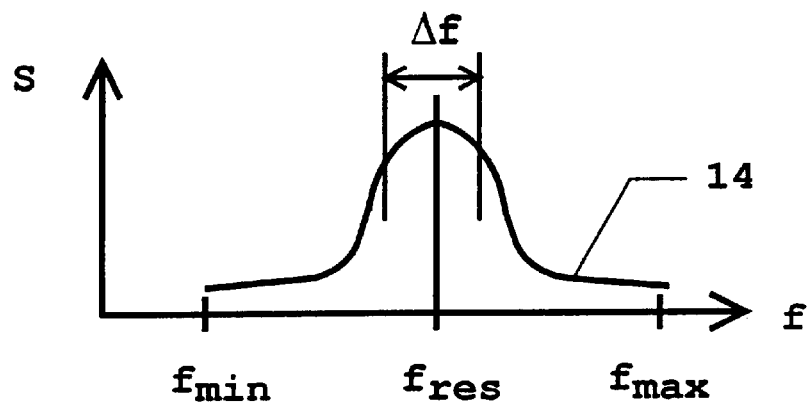
FIG. 3 is a diagram illustrating a restricted frequency sweep in a first embodiment of the method according to the invention.

A restricted frequency sweep Δf according to FIG. 3 can be performed for achieving a high resolution frequency sweep in identifying the resonant frequency $f_{res}$ with limited interference with the system's function. A restricted frequency sweep Δf is shown above the complete admittance curve from FIG. 2 to illustrate this.

The restricted frequency sweep Δf can be selected so it is only marginally greater than the signal drift anticipated in the electronics and load impedance 4. In principle, this is equivalent to repeated fine tuning of the resonant frequency $f_{res}$.

The interval between each repeated sweep can be reduced at the same time as the sweep rate is reduced without any major impact on function. Alternately, this can be utilized in minimizing functional interference.

Figure 4:
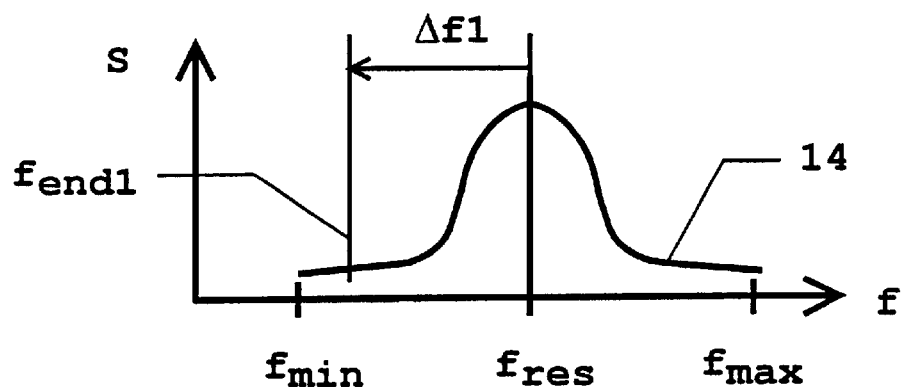
FIG. 4 is a diagram illustrating a first restricted frequency sweep in a second embodiment of the method according to the invention.
Figure 5:
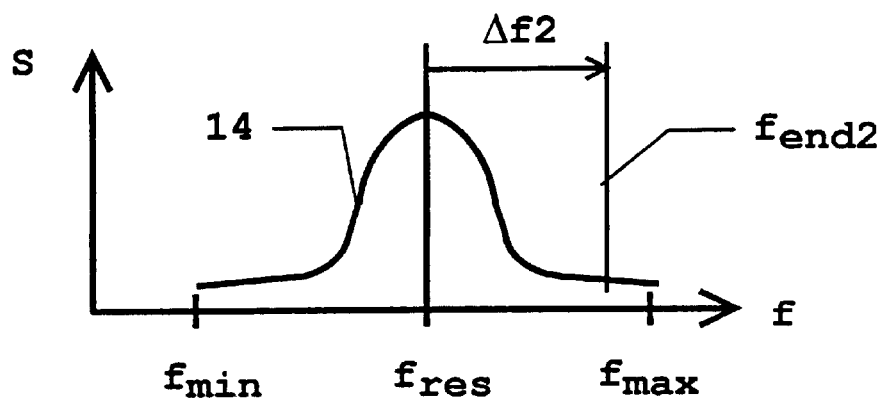
FIG. 5 is a diagram illustrating a second restricted frequency sweep according to the second embodiment of the inventive method.

An alternative method is illustrated in FIGS. 4 and 5 to which the following description refers. Here, the method is also illustrated in relation to the conductance curve 14 from the first sweep. Here, a restricted frequency sweep is performed setting from the most recently identified resonant frequency $f_{res}'$ i.e. the existing output signal from the tuner. In a first phase, the restricted frequency sweep Δf1 is performed downwards to a lower end frequency $f_{end1}$. This lower end frequency $f_{end1}$ can be the lowest frequency $f_{min}$ in the first frequency sweep, but may be higher than that. If a new resonant frequency $f_{res}$ is identified during this "semi-sweep", the tuner locks the output signal to the new resonant frequency $f_{res}$. Otherwise, the previously identified resonant frequency $f_{res}$ is retained.

After a specific period of time, a second restricted frequency sweep Δf2 is performed. The second restricted frequency sweep Δf2 starts from the most recently identified resonant frequency $f_{res}$ and moves up to an upper end frequency $f_{end2}$. In the same way as in the first restricted frequency sweep Δf1, the upper end frequency $f_{end2}$ can be the highest frequency $f_{max}$ in the first frequency sweep or a lower frequency. If a new resonant frequency $f_{res}$ is identified, the tuner's output signal is locked to it. Otherwise the output signal is retained.

After yet another period of time, the whole procedure is repeated with the first restricted frequency sweep Δf1.

This alternative embodiment offers about the same advantages and opportunities as the extremely narrow frequency sweep in FIG. 3, especially when the end frequencies $f_{end1}$ and $f_{end2}$ are selected according to the same premises. Another advantage of the latter embodiment is that the sweep is begun with a fully modulated system. This also reduces interference with drift in relation to sweeps in which the sweeps move from a minimum to a maximum with the resonant frequency somewhere in between.

Combinations of the different embodiments are also possible. For example, the different types of frequency sweeps can be alternated at different intervals in order to optimize system operation. Thus, a first complete frequency sweep can be followed by a number of extremely limited sweeps according to FIG. 3 (with a specific interval between each sweep). One or a number of sweeps according to FIGS. 4 and 5 can thereupon be performed to ensure that the output signal really is at the best resonant frequency for the system. Additional sweeps with extremely narrow frequency ranges can then be performed.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for seeking and setting a resonant frequency for a load impedance, comprising the steps of:

making a first frequency sweep through a predetermined frequency interval having a lower end frequency and an upper end frequency and identifying a resonant frequency of a load impedance in said predetermined frequency interval; and subsequently conducting repeated frequency sweeps within said predetermined frequency interval identifying and, in each of said repeated frequency sweeps, identifying the resonant frequency of said load impedance, by alternatively sweeping in a restricted frequency range between a most recently identified resonant frequency and said lower end frequency and between a most recently identified resonant frequency and said upper end frequency.

2. A method as claimed in claim 1 comprising, in said first frequency sweep and in said repeated frequency sweeps, identifying the resonant frequency of said load impedance as a frequency resulting in a lowest output signal required for maintaining a constant current consumption in said load impedance.

3. A method as claimed in claim 1 comprising conducting said repeated frequency sweeps at predetermined intervals from each other.

4. A tuner comprising:

sweep electronics adapted for connection to a load impedance for conducting sweeps within a predetermined frequency interval having a lower end frequency and an upper end frequency to identify a resonant frequency of said load impedance and for generating an output signal representative of said resonant frequency; and a control unit connected to said sweep electronics for operating said sweep electronics to repeatedly sweep frequencies within said predetermined frequency interval to repeatedly identify said resonant frequency, by alternatively sweeping in a restricted frequency range between a most recently identified resonant frequency and said lower end frequency and between a most recently identified resonant frequency and said upper end frequency.

5. A tuner as claimed in claim 4 wherein said control unit operates said sweep electronics to repeatedly sweep said frequency interval at predetermined time intervals.

6. A tuner as claimed in claim 4 comprising a plurality of components subject to component variations and signal drift, and wherein said control unit set said restricted frequency range to encompass a frequency range correlated to said variations and signal drift, as well as correlated to changes in said resonant frequency of said load.

7. A tuner as claimed in claim 4 wherein said lower end frequency comprises a lowest frequency in said predetermined frequency interval, and wherein said upper end frequency comprises a highest frequency in said predetermined frequency interval.

8. A tuner as claimed in claim 4 comprising an output stage adapted for connection to said load impedance, said output stage supplying a current to said load impedance, and said tuner further comprising a current measuring unit connected to said output stage to measure a feedback current from said output stage representing an actual current through said load impedance, means for modulating said output stage to provide a constant current consumption by said load impedance and wherein said control unit identifies said resonant frequency as a frequency resulting in a lowest output signal from said output stage while maintaining said constant current consumption.

\* \* \* \* \*